United States Patent
Hsu et al.

(10) Patent No.: US 7,038,899 B2
(45) Date of Patent: May 2, 2006

(54) EMI SUPPRESSION DEVICE

(75) Inventors: Han-cheng Hsu, Taoyuan (TW); Wen-te Ko, Kaohsiung (TW)

(73) Assignee: Delta Electronics, Inc., Taoyuan (TW)

( * ) Notice: Subject to any disclaimer, the term of this patent is extended or adjusted under 35 U.S.C. 154(b) by 477 days.

(21) Appl. No.: 10/615,034

(22) Filed: Jul. 9, 2003

(65) Prior Publication Data

US 2004/0114298 A1    Jun. 17, 2004

(30) Foreign Application Priority Data

Dec. 17, 2002    (TW) .............................. 91220528 U

(51) Int. Cl.
  *H02H 9/06*   (2006.01)
(52) U.S. Cl. ........................................... 361/118
(58) Field of Classification Search ............... 361/111, 361/118
  See application file for complete search history.

(56) References Cited

U.S. PATENT DOCUMENTS

| | | | | |
|---|---|---|---|---|
| 5,635,775 A | * | 6/1997 | Colburn et al. ............... 307/91 |
| 5,687,233 A | * | 11/1997 | Loudermilk et al. ........ 379/442 |
| 5,736,910 A | * | 4/1998 | Townsend et al. ........... 333/181 |
| 5,831,505 A | * | 11/1998 | Yamaguchi et al. .......... 336/83 |
| 6,428,361 B1 | * | 8/2002 | Imschweiler et al. ....... 439/676 |
| 6,525,638 B1 | * | 2/2003 | Oi .............................. 336/215 |
| 6,650,525 B1 | * | 11/2003 | Anthony ..................... 361/111 |

\* cited by examiner

*Primary Examiner*—Brian Sircus
*Assistant Examiner*—Boris Benenson
(74) *Attorney, Agent, or Firm*—Birch, Stewart, Kolasch & Birch, LLP

(57) ABSTRACT

An electromagnetic interference (EMI) suppression device includes a case, a common mode noise reduction element, a plurality of conductive pillars and at least one differential mode noise reduction element. The case includes a housing that can accommodate the common mode noise reduction element and a plurality of foot portions that protrude from the housing. A plurality of conductive pillars penetrate the case to form two separate portions, a mount for receiving differential mode noise reduction elements and a connection pad, and the EMI suppression device is mounted onto a printed circuit board via the connection pad.

10 Claims, 4 Drawing Sheets

EMI SUPPRESSION DEVICE

BACKGROUND OF THE INVENTION (a) Field of the Invention

The invention relates to an electromagnetic interference (EMI) suppression device and, more particularly, to an EMI suppression device used for the prevention of both common mode and differential mode noises.

(b) Description of the Related Art

Generally, noises that affect signal lines or power lines are categorized as common mode and differential mode noises. Common mode noises, also called asymmetrical-mode noises, are noises in two signal lines having the same phase but a minute difference in amplitude; differential mode noises, also called symmetrical-mode noises, are noises in two signal lines having the same amplitude but with 180 degree phase difference. These two types of noises commonly exist in input or output lines.

Solution elements regularly used for reducing differential mode noises are often made of ferrite beads, which can provide a proper impedance characteristic at high frequencies to absorb unwanted noises. FIGS. 1A and 1B show schematic views where a ferrite bead 106 is adopted to suppress differential mode noises. Referring to FIG. 1A, there is shown a simple RC circuit including a power supply 100, an amplifier 102, a capacitor C and a resistor R. An oscilloscope 104 coupled to RC circuit displays the output waveform disrupted by differential mode noises, as illustrated in FIG. 1A. When a ferrite bead 106 is connected to the RC circuit, shown in FIG. 1B, the impedance characteristic of the ferrite bead 106 functions to absorb the noises, and the RC circuit can finally output a filtered waveform as illustrated in FIG. 1B.

In addition, solution elements regularly used for reducing common mode noises are often made of a common mode choke for removing noises produced from the signal line and the fluctuations of the ground voltage. The operating principle for the common mode choke is that when currents having the same phase (that is, common mode currents) flow in, an impedance for filtering the noise is generated because of the added magnetic induction induced by the currents. To the contrary, when currents in opposite phase (that is, differential mode currents) flow in, the magnetic induction induced by the currents is cancelled by each other. In other words, common mode chokes leave differential mode currents unaffected while selectively attenuates the noise with respect to common mode currents. FIG. 2 shows the noise attenuation at different frequencies done by a common mode choke. It is observed that the filtering effect of a common mode choke is more apparent at high frequencies.

In a prior method, the aforesaid EMI suppression elements for common mode and differential mode noises, namely common mode chokes and ferrite beads, are arbitrarily spread on a printed circuit board (PCB) for reducing both common mode and differential mode noises. However, it is necessary that spaces for various elements are reserved on distinct areas of the PCB, and therefore the space flexibility for a circuit layout is limited and more fabrication time is needed. Furthermore, the method of arbitrarily spreading the various EMI suppression elements over the PCB is liable to raise other unpredictable issues, caused by the wires in the layout having short distances in between.

SUMMARY OF THE INVENTION

Therefore, an object of the invention is to provide an EMI suppression device that, where common mode and differential mode noise solution elements are incorporated in a compact case, achieves the effect of reducing both common mode and differential mode noises simply by one step of mounting an integrated structure on a printed circuit board.

The EMI suppression device in accordance with the invention includes a case, a common mode noise reduction element, a plurality of conductive pillars and at least one differential mode noise reduction element. The case forms with a housing that can accommodate a common mode noise reduction element and a plurality of foot portions that protrude from the housing. A plurality of conductive pillars penetrate the foot portions to form two separate portions, a mount for receiving differential mode noise reduction elements and a connection pad, and the EMI suppression device is mounted onto a printed circuit board via the connection pad.

Preferably, the common mode noise reduction element is a common mode choke, and the differential mode noise reduction element is a ferrite bead.

Since the common mode and differential mode noise solution elements are incorporated in a compact case, the integrated structure can cut down the space needed for the circuit layout and avoid unpredictable issues caused by the EMI suppression elements arbitrary spreading on the PCB. Moreover, taking surface-mount device fabrication processes into consideration, the EMI suppression device can be speedily mounted on the PCB in one-step and thus the fabrication process can be enormously simplified. Further, when there is a demand for removing the EMI suppression elements from the PCB, i.e., rework, the rework time may be further minimized.

DETAILED DESCRIPTION OF THE PREFERRED EMBODIMENTS

Figure 1A:
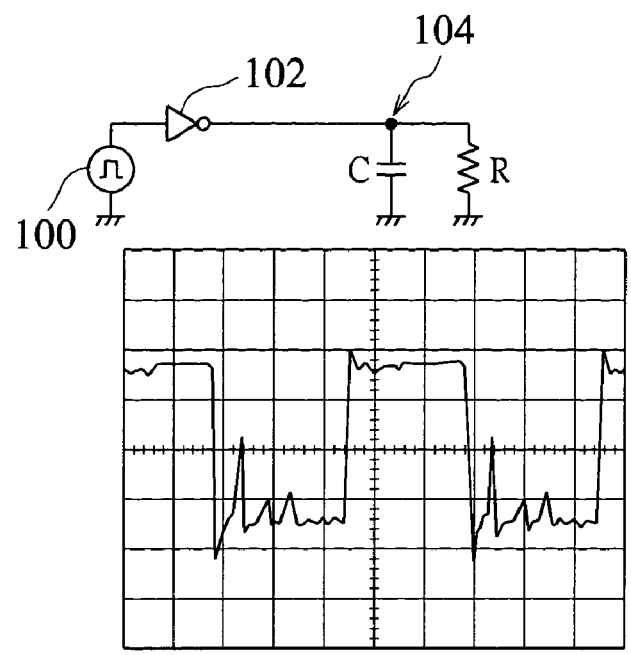
FIGS. 1A and 1B are schematic views illustrating a ferrite bead being used for suppressing EMI.
Figure 1B:
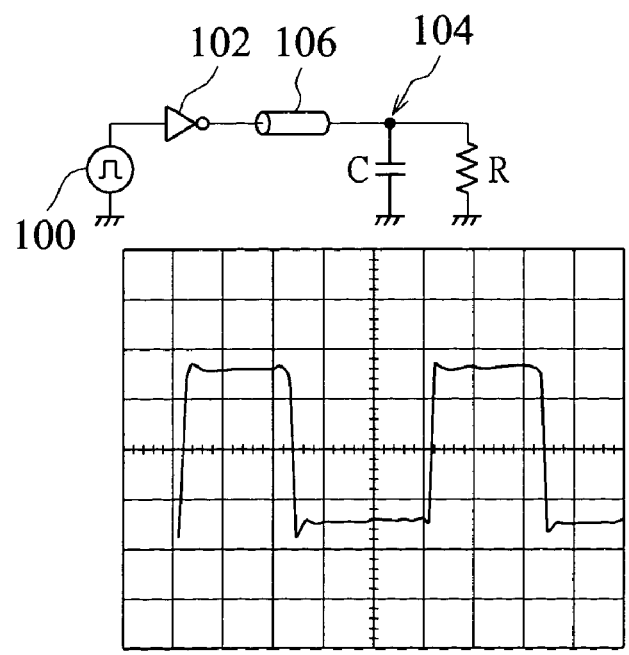
Figure 2:
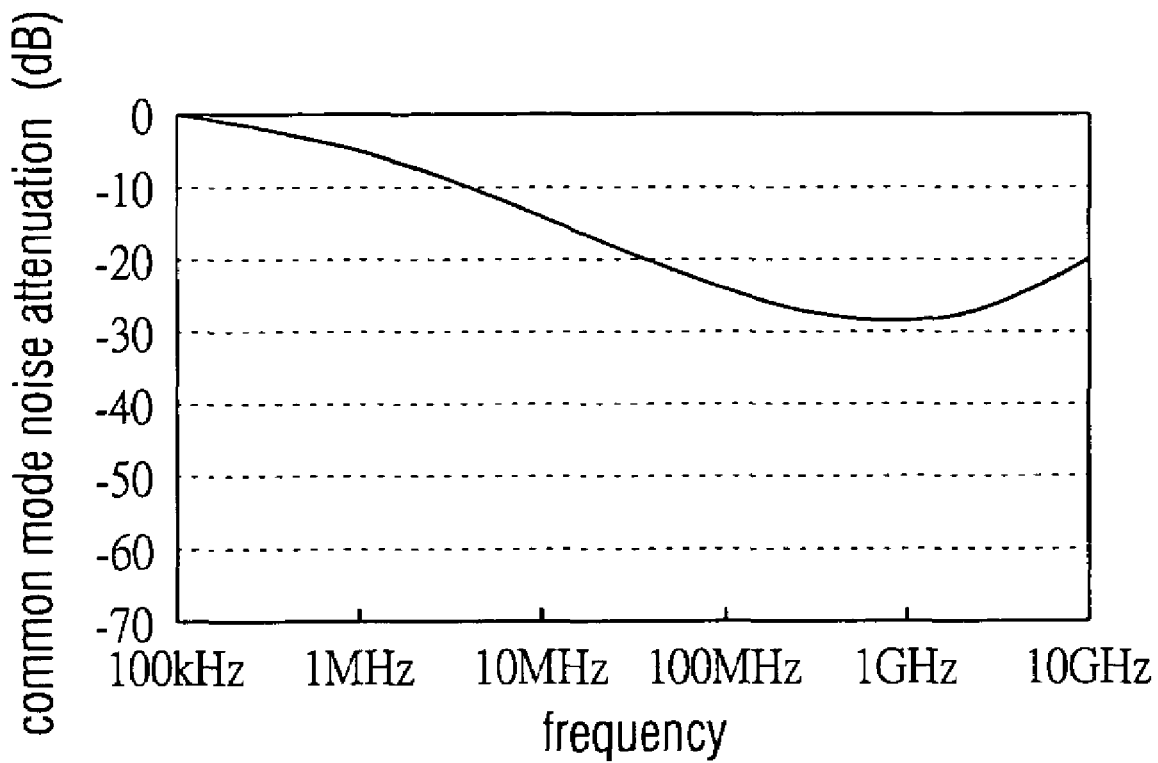
FIG. 2 shows noise attenuation at different frequencies done by a common mode choke.
Figure 3:
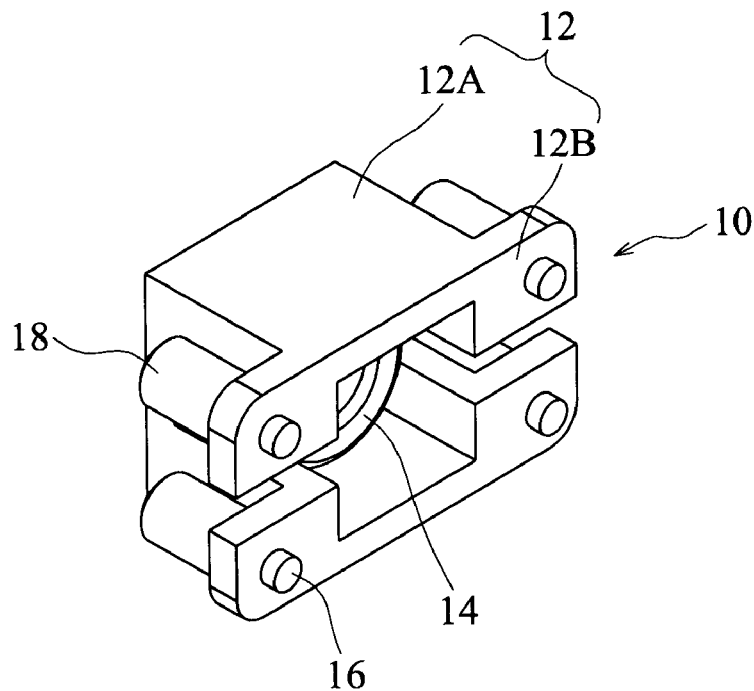
FIG. 3 shows a perspective view illustrating an embodiment of the EMI suppression device according to the invention.
Figure 4:
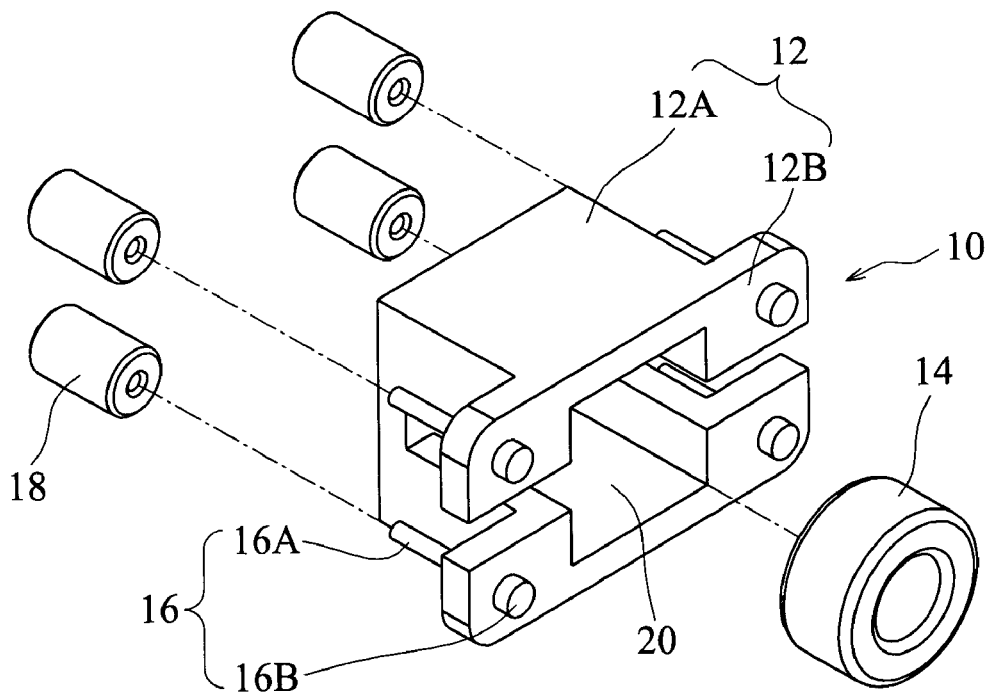
FIG. 4 shows an exploded view illustrating the members of the EMI suppression device.

FIG. 3 shows a perspective view illustrating an embodiment of the electromagnetic interference (EMI) suppression device 10 according to the invention, and FIG. 4 shows an exploded view illustrating the members of the EMI suppression device 10. Referring to FIG. 3, the device includes a case 12, a common mode choke 14, four conductive pillars 16 and a plurality of ferrite beads 18.

Referring to FIG. 4, the case 12 where a cavity 20 is formed for accommodating the common mode choke 14 forms with a housing 12A and four foot portions 12B protruding from the edge of the housing 12A. Each of the conductive pillars 16 penetrates through the foot portion 12B of the case 12 so as to form two separate portion, a mount 16A for receiving the ferrite elements 18 and a connection pad 16B.

Figure 5:
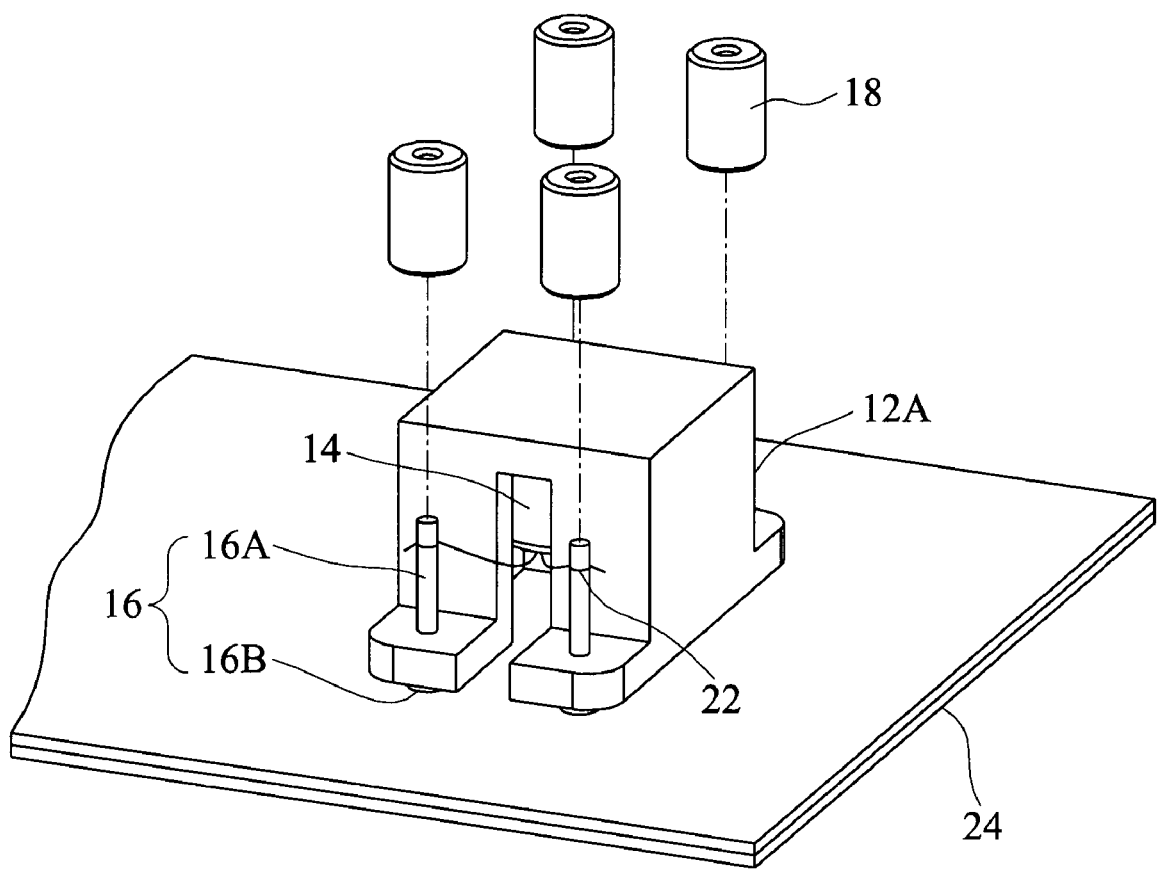
FIG. 5 is a schematic view showing the winding of the common mode choke in the EMI suppression device according to the invention.

In the EMI suppression device 10 in accordance with the invention, the common mode choke 14 is accommodated in the cavity 20 of the case 12 as indicated in FIG. 4, and each of the ferrite beads 18 is coupled to the mount 16A of the conductive pillars 16 and then fixed on the conductive pillar 16 by an adhesive or other physical adhesion. Then, the winding of the common mode choke 14 is carried out as indicated in FIG. 5 to extend outward through the gaps of the housing 12A to further electrically connect to the ferrite beads 18. Such integrated EMI device 10, therefore, can be directly mounted onto a printed circuit board (PCB) 24 via the connection pad 16B of the conductive pillar 16 by means of surface mounting technology (SMT).

Figure 6:
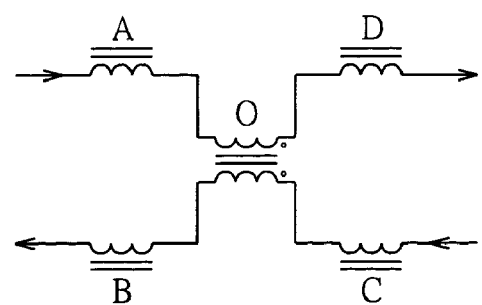
FIG. 6 shows a corresponding circuit diagram of the EMI suppression device according to the invention.

The EMI suppression device 10 is directly mounted on a PCB and electrically connected to the input and output terminals of a pair of signal lines so as to reduce both the differential mode and common mode noises. FIG. 6 shows a corresponding circuit diagram of the EMI suppression device 10 in accordance with the invention. As shown in FIG. 6, common mode noises are reduced by the common mode choke 14 at the point O, and differential mode noises are also reduced by the ferrite beads 18 at the points A, B, C and D. The number of the ferrite beads 18 coupled to the pillars 16 is not limited to four, but depends on the actual needs to reduce differential mode noises of the signal lines at the points A, B, C and D.

Since both common mode and differential mode noise solution elements are incorporated in a compact case according to the invention, the space needed for the circuit layout is cut down and the unpredictable issues caused by the EMI suppression elements arbitrary spreading on the PCB is avoided. Moreover, taking surface-mount device (SMD) fabrication processes into consideration, the EMI suppression device 10 can be speedily mounted on the PCB in one-step and thus the fabrication process can be enormously simplified. Further, when there is a demand for removing the EMI suppression elements from the PCB, the rework time may be further minimized.

Further, the case 12 may be formed in one-piece by plastic injection molding. Also, the conductive pillars 16 can be made of any electrically conductive materials such as metal, and its shape is not limited to any specific form.

Referring to FIG. 5, on the surface of the conductive pillars 16 may also be formed with a notch 22, so that the winding of the common mode choke 14 may be winded upon it to facilitate the fixation of the winding during the fabrication of the EMI suppression device.

While the invention has been described by way of example and in terms of the preferred embodiment, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. An electromagnetic interference (EMI) suppression device for suppressing both common mode and differential mode noises, comprising:
   a case;
   a common mode noise reduction element accommodated in the case;
   a plurality of conductive pillars, each penetrating through the case to form a connection pad; and
   at least one differential mode noise reduction element fixed to the conductive pillar and electrically connected to the common mode noise reduction element; wherein
   the EMI device is mounted onto a printed circuit board (PCB) via the connection pad.

2. The EMI suppression device as described in claim 1, wherein the common mode noise reduction element is a common mode choke.

3. The EMI suppression device as described in claim 1, wherein the differential mode noise reduction element is a ferrite bead.

4. The EMI suppression device as described in claim 1, wherein the case is made of plastic.

5. The EMI suppression device as described in claim 1, wherein the conductive pillars are made of metal.

6. The EMI suppression device as described in claim 1, wherein the differential mode noise reduction element is fixed to the conductive pillars by means of an adhesive.

7. The EMI suppression device as described in claim 1, wherein on the surface of the conductive pillar is formed with a notch.

8. An electromagnetic interference (EMI) suppression device for suppressing both common mode and differential mode noises, comprising:
   a case having a housing and a plurality of foot portions protruding from the housing;
   a common mode noise reduction element accommodated in the housing;
   a plurality of conductive pillars, each penetrating through the case to form two separate portions, a mount and a connection pad; and
   at least one differential mode noise reduction element fixed to the mounts of the conductive pillars and electrically connected to the common mode noise reduction element; wherein
   the EMI device is mounted onto a PCB via the connection pads.

9. The EMI suppression device as described in claim 8, wherein the differential mode noise reduction element is fixed to the conductive pillars by means of an adhesive.

10. The EMI suppression device as described in claim 1, wherein on the surface of the conductive pillar is formed with a notch.

* * * * *